(12) United States Patent
Lee et al.

(10) Patent No.: US 12,063,875 B2
(45) Date of Patent: Aug. 13, 2024

(54) METHOD FOR MANUFACTURING RESISTIVE RANDOM ACCESS MEMORY STRUCTURE

(71) Applicant: Winbond Electronics Corp., Taichung (TW)

(72) Inventors: Yen-De Lee, Taichung (TW);
Ching-Yung Wang, Taichung (TW);
Chien-Hsiang Yu, Taichung (TW);
Hung-Sheng Chen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 18/324,709

(22) Filed: May 26, 2023

(65) Prior Publication Data

US 2023/0301206 A1  Sep. 21, 2023

Related U.S. Application Data

(62) Division of application No. 16/996,552, filed on Aug. 18, 2020, now Pat. No. 11,737,380.

(30) Foreign Application Priority Data

Aug. 26, 2019 (TW) ................. 108130379

(51) Int. Cl.
*H01L 45/00* (2006.01)
*H10B 63/00* (2023.01)
*H10N 70/00* (2023.01)

(52) U.S. Cl.
CPC .......... *H10N 70/063* (2023.02); *H10B 63/80* (2023.02); *H10N 70/066* (2023.02); *H10N 70/841* (2023.02)

(58) Field of Classification Search
CPC ... H10N 70/063; H10N 70/066; H10N 70/841
See application file for complete search history.

(56) References Cited

U.S. PATENT DOCUMENTS

| | | | |
|---|---|---|---|
| 11,329,222 B2 | 5/2022 | Hsu et al. | |
| 11,737,380 B2 * | 8/2023 | Lee .................. | H10N 70/063 |
| 2012/0087181 A1 | 4/2012 | Lung et al. | |
| 2012/0139022 A1 | 6/2012 | Lin et al. | |
| 2012/0248529 A1 | 10/2012 | Liu et al. | |
| 2015/0048297 A1 | 2/2015 | Hseh et al. | |

* cited by examiner

*Primary Examiner* — Mark V Prenty
(74) *Attorney, Agent, or Firm* — Muncy, Geissler, Olds & Lowe, P.C.

(57) ABSTRACT

A method for manufacturing a resistive random access memory structure is provided. The method includes providing a substrate, and the substrate includes an array region and a peripheral region. The method includes forming a first low-k dielectric layer in the peripheral region, and the first low-k dielectric layer has a dielectric constant of less than 3. The method includes forming a plurality of memory cells on the substrate and in the array region. The method includes forming a dummy memory cell at a boundary between the array region and the peripheral region. The method includes forming a gap-filling dielectric layer on the substrate. The method includes forming a plurality of first conductive plugs in the gap-filling dielectric layer, and each of the plurality of first conductive plugs is in contact with one of the plurality of memory cells.

10 Claims, 6 Drawing Sheets

METHOD FOR MANUFACTURING RESISTIVE RANDOM ACCESS MEMORY STRUCTURE

CROSS REFERENCE TO RELATED APPLICATIONS

This Application is a Divisional Application of U.S. patent application Ser. No. 16/996,552 filed on Aug. 18, 2020, which claims priority of Taiwan Patent Application No. 108130379, filed on Aug. 26, 2019, the entirety of which is incorporated by reference herein.

BACKGROUND OF THE INVENTION

Field of the Invention

The present disclosure relates to a memory device, and in particular, it relates to a resistive random access memory structure and a method for manufacturing the resistive random access memory structure.

Description of the Related Art

Resistive random access memory (RRAM) has the following advantages: a simple structure, small area, small operating voltage, fast operating speed, long memory time, multi-state memory, and low power consumption. Therefore, the resistive random access memory has great potential to replace the current flash memory and become the mainstream of non-volatile memory for the next generation.

In a conventional resistive random access memory, a chip generally includes an array region and a peripheral region. The array region includes a plurality of memory cells, and each memory cell includes a patterned bottom electrode layer, a patterned resistance switching layer, and a patterned top electrode layer. A logic circuit may be formed in the peripheral region. In order to increase the operating speed of the logic circuit, a low dielectric constant (low-k) dielectric material is used for the dielectric layer located in the peripheral region. In the array area, the space between two adjacent memory cells is small. When a low-k dielectric material is formed between the adjacent memory cells, the gap-filling ability of the low-k dielectric material is poor. This causes voids to be formed between the adjacent memory cells. As a result, the operation errors of the resistive random access memory device may occur easily, and the yield and reliability of the product may deteriorate.

In the memory industry, in order to improve the reliability and yield of resistive random access memory, and to reduce the cost and time required for production, there is a need to improve the resistive random access memory and the manufacturing process thereof.

BRIEF SUMMARY OF THE INVENTION

The disclosure provides a resistive random access memory structure and a method for manufacturing the same. The manufacturing method of the resistive random access memory structure can significantly improve the yield and reliability of the product, and can reduce the complexity of the process, the production cost, and the production time.

In accordance with some embodiments of the present disclosure, a method for manufacturing a resistive random access memory structure is provided. The method includes providing a substrate, and the substrate comprises an array region and a peripheral region. The method includes forming a first low-k dielectric layer in the peripheral region, and the first low-k dielectric layer has a dielectric constant of less than 3. The method includes forming a plurality of memory cells on the substrate and in the array region. The method includes forming a dummy memory cell at a boundary between the array region and the peripheral region. The method includes forming a gap-filling dielectric layer on the substrate, wherein the gap-filling dielectric layer covers the plurality of memory cells and the dummy memory cell in the array region. The gap-filling dielectric layer covers the first low-k dielectric layer located in the peripheral region. The material of the gap-filling dielectric layer is different from the material of the first low-k dielectric layer. The method includes forming a plurality of first conductive plugs in the gap-filling dielectric layer, and each of the plurality of first conductive plugs is in contact with one of the plurality of memory cells. The dummy memory cell is not in contact with any one of the plurality of first conductive plugs.

In the manufacturing method of the resistive random access memory structure provided by the embodiments of the present invention, before forming the memory cells in the array region, a layer of low-k dielectric material is formed in the peripheral region. In the manufacturing method, simultaneous polish of the low-k dielectric material in the peripheral region and the gap-filling dielectric material in the array region can be avoided. Therefore, even if the dielectric layer located in the array region and the dielectric layer located in the peripheral region use different dielectric materials, cracks can be avoided at the boundary between the peripheral region and the array region. In other words, in the manufacturing method provided by the embodiments of the present invention, the dielectric material of the array region and the dielectric material of the peripheral region can be independently selected according to their requirements. As a result, the yield and reliability of the product can be significantly improved without significantly increasing the complexity of the process, the production cost, or the required production time.

DETAILED DESCRIPTION OF THE INVENTION

Figure 1A:
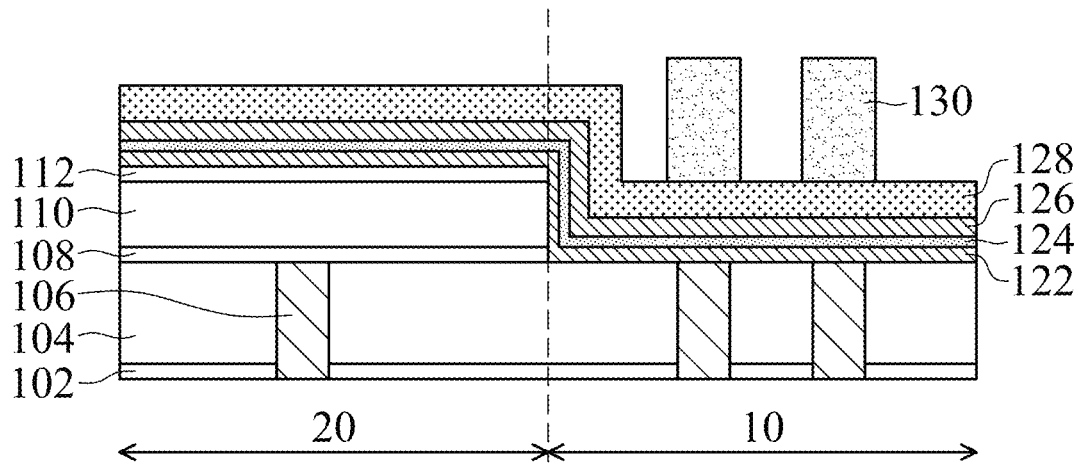
FIGS. 1A-1E are cross-sectional views corresponding to various steps of manufacturing a resistive random access memory structure in accordance with some embodiments.

Referring to FIG. 1A, a substrate 102 is provided, and the substrate 102 includes an array region 10 and a peripheral region 20 surrounding the array region 10. Next, an insulating layer 104 is formed on the substrate 102. The insulating layer 104 may be, for example, silicon oxide. Next, a patterning process is performed on the insulating layer 104 to form an opening. Next, a metal material is filled into the opening to form a contact plug 106 in the insulating layer 104. In the present embodiment, the contact plug 106 is a single-layer conductive structure. In another embodiment, the contact plug 106 includes a liner layer and a conductive layer. The liner layer can improve the adhesion between the conductive layer and the substrate 102 or the insulating layer 104, and can prevent metal ions from diffusing into the substrate 102 or the insulating layer 104. The material of the liner layer may be, for example, titanium nitride. The material of the conductive layer may be, for example, copper.

Next, a pad layer 108, a first low-k dielectric layer 110, and a first polishing stop layer 112 are sequentially formed on the insulating layer 104. Then, the peripheral region 20 is masked and an etching process is performed to expose the top surface of the insulating layer 104 and the contact plug 106 in the array region 10. The pad layer 108 can prevent moisture or hydrogen from entering the underlying substrate 102. The pad layer 108 may be, for example, silicon nitride. The dielectric constant of the first low-k dielectric layer 110 is less than 3, so that the operating speed of the logic circuit located in the peripheral region 20 can be increased, and the material may be, for example, Black diamond™.

Next, a bottom electrode layer 122, a resistance switching layer 124, a top electrode layer 126, and a hard mask layer 128 are sequentially formed, as shown in FIG. 1A.

The bottom electrode layer 122 may be electrically connected to other elements (not shown) through the contact plug 106. The bottom electrode layer 122 and the top electrode layer 126 may independently have a single-layer structure or a multi-layer structure. In some embodiments, the bottom electrode layer 122 is a single-layer structure formed of titanium nitride, and the top electrode layer 126 is a single-layer structure formed of titanium. The bottom electrode layer 122 and the top electrode layer 126 may be formed by a physical vapor deposition process. The material of the resistance switching layer 124 may include a single layer or multiple layers of a transition metal oxide, for example, hafnium oxide ($HfO_2$). The resistance switching layer 124 may be formed by, for example, an atomic layer deposition process.

Next, a mask layer is formed and patterned to form a plurality of mask patterns 130 in the array region 10. As shown in FIG. 1A, the position of each of the mask patterns 130 corresponds to the position of one of the contact plugs 106.

Figure 1B:
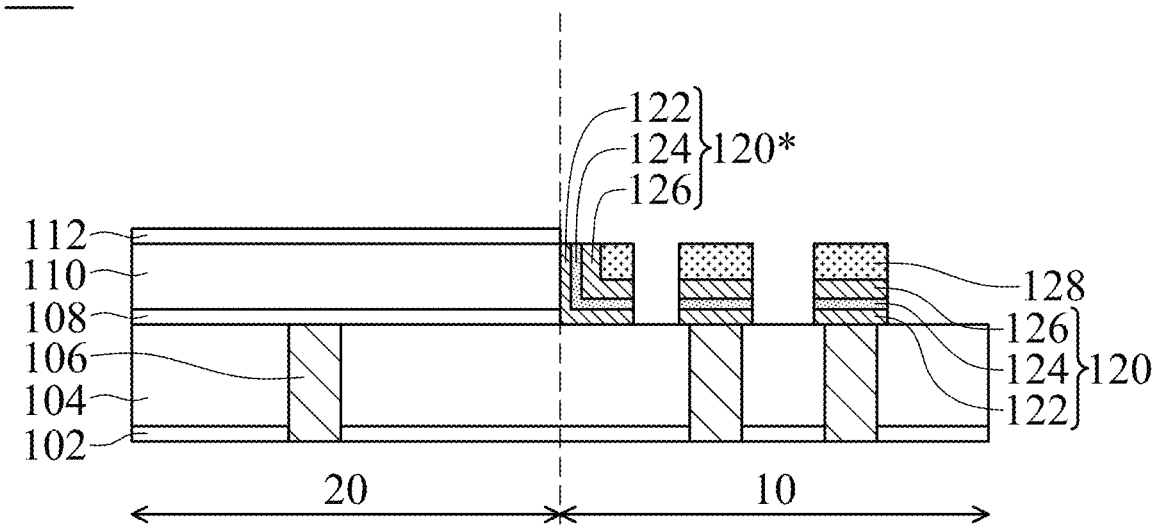

Referring to FIG. 1B, a patterning process is performed to remove the bottom electrode layer 122, the resistance switching layer 124, the top electrode layer 126, and the hard mask layer 128 which are not covered by the mask pattern 130. The patterning process may be an anisotropic etching process. After the patterning process, a plurality of memory cells 120 are formed on the substrate 102 in the array region 10. The position of each of the memory cells 120 correspond to one of the position of the contact plugs 106, and each of the memory cells 120 is electrically connected to one of the contact plugs 106.

Figure 3:
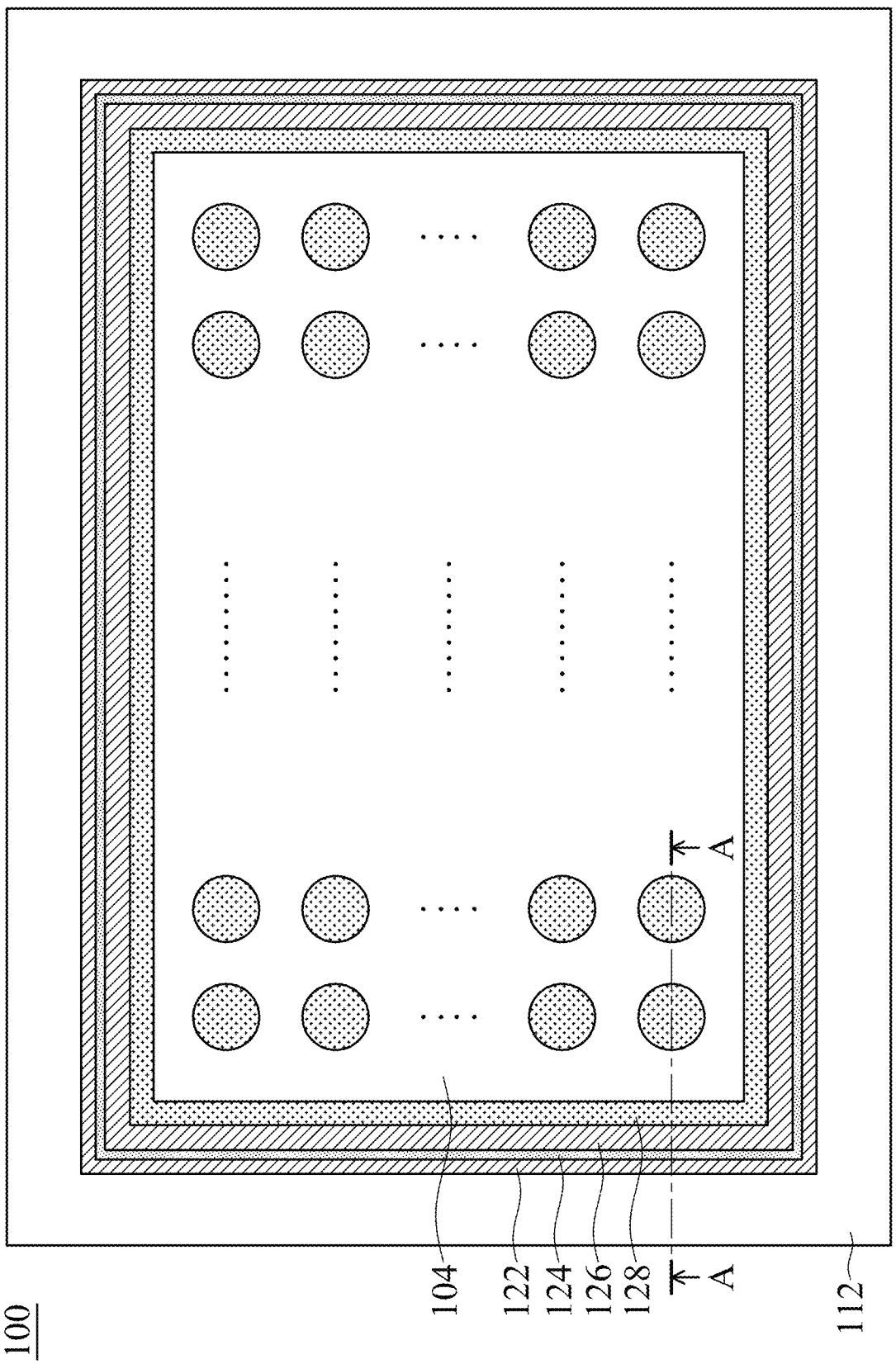
FIG. 3 is a top-view of the resistive random access memory structure of FIG. 1B in accordance with some embodiments.

The patterning process also forms a dummy memory cell 120* at the boundary between the array region 10 and the peripheral region 20. The dummy memory cell 120* is not electrically connected to the contact plug 106. FIG. 3 is a top-view of the resistive random access memory structure 100 of FIG. 1B in accordance with some embodiments, and FIG. 1B is drawn along the line A-A in FIG. 3. In the top-view, the dummy memory cell 120* has a continuous ring shape surrounding the array region 10. The dummy memory cell 120* has an L-shaped cross-sectional profile, and the hard mask layer 128 remaining on the dummy memory cell 120* has a rectangular cross-sectional profile. More specifically, the bottom electrode layer 122, the resistance switching layer 124, and the top electrode layer 126 of the dummy memory cell 120* have an L-shaped cross-sectional profile.

It should be understood that the shape of the dummy memory cell 120* shown in FIG. 3 is only for illustration, and is not intended to limit the present invention. For example, in the top-view, the array region 10 may be a triangle, an irregular polygon, a circle, an oval, or other suitable shapes. Therefore, the dummy memory cell 120* may have a continuous ring shape surrounding the array region 10. In other embodiments, in the top-view, the dummy memory cell 120* has a discontinuous ring shape surrounding the array region 10, and the discontinuous ring type includes a plurality of segments. In addition, the cross-sectional profiles of the dummy memory cell 120* and the hard mask layer 128 shown in FIG. 1B are also used for illustration only, and are not intended to limit the present invention. For example, the dummy memory cell 120* may have a rectangular cross-sectional profile. That is, the bottom electrode layer 122 and the resistance switching layer 124 of the dummy memory cell 120* have an L-shaped cross-sectional profile, and the top electrode layer 126 has a rectangular cross-sectional profile. In some embodiments, no hard mask layer 128 remains on the dummy memory cell 120*. In other embodiments, the hard mask layer 128 has a cross-sectional profile that gradually tapered upwardly. In some embodiments, the profile of the hard mask layer 128 has rounded corners.

Figure 1C:
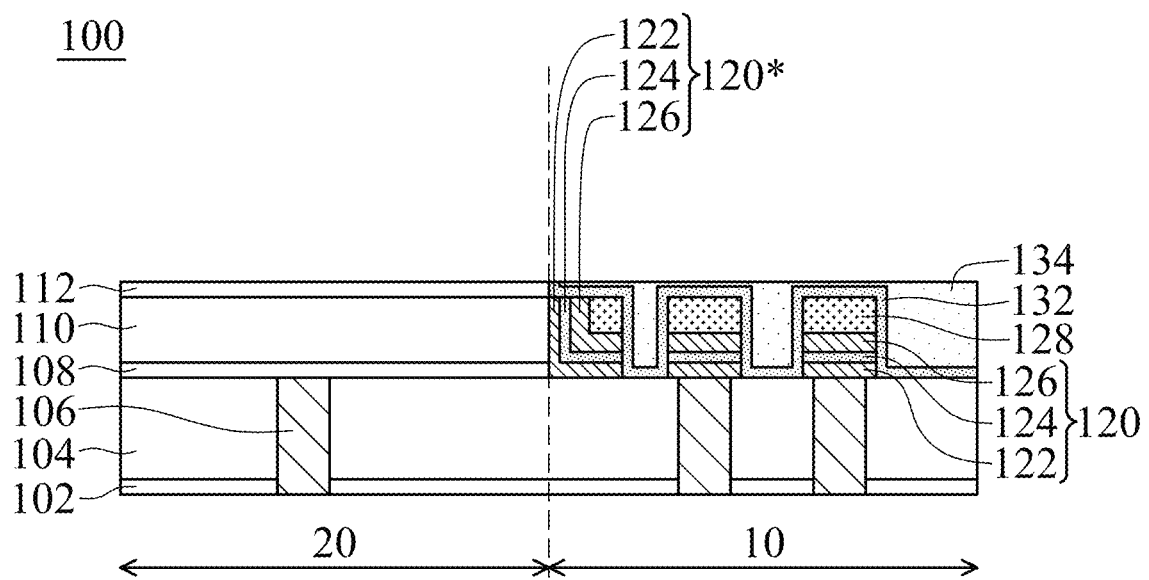

Referring to FIG. 1C, a protective layer 132 is conformally formed on the substrate 102. In the array region 10, the protective layer 132 conformally covers the memory cell 120 and the dummy memory cell 120*. In the peripheral region 20, the protective layer 132 covers the first polishing stop layer 112. Next, a gap-filling dielectric layer 134 is formed on the substrate 102. In the array region 10, the gap-filling dielectric layer 134 covers the memory cell 120 and the dummy memory cell 120*. In the peripheral region 20, the gap-filling dielectric layer 134 covers the protective layer 132, the first polishing stop layer 112, and the first low-k dielectric layer 110. Next, a first planarization process (for example, a chemical mechanical polishing process) is performed to make the top surface of the first polishing stop layer 112 and the top surface of the gap-filling dielectric layer 134 coplanar with each other.

The protective layer 132 may be a single-layer structure formed of a single material or a multi-layer structure formed of a plurality of different materials. In some embodiments, the protective layer 132 is a dual-layer structure formed by a hydrogen barrier layer and a spacer layer formed on the hydrogen barrier layer. Therefore, the hydrogen barrier layer can prevent hydrogen from entering the substrate 102 and thus can avoid deterioration or failure of the resistive random access memory structure. The material of the hydrogen barrier layer may be metal oxide or metal nitride. The spacer layer can reduce or prevent the damage of the memory cell 120 during the subsequent processes. The material of the spacer layer may be, for example, silicon oxide or silicon nitride. In the present embodiment, the protective layer 132 is a single-layer structure formed of aluminium oxide. In the present embodiment, after the first planarization process, the protective layer 132 covering the memory cell 120 is not exposed. Therefore, the protective layer 132 and the memory cell 120 underlying the protective layer 132 can be prevented from being damaged.

The material of the gap-filling dielectric layer 134 is different from the material of the first low-k dielectric layer 110. Because the gap-filling dielectric layer 134 has a good gap-filling ability, it can prevent voids from being generated between the memory cells 120. As a result, operation errors of the resistive random access memory structure can be reduced or avoided, and the yield and reliability of the product can be significantly improved. The material of the gap-filling dielectric layer 134 may include an oxide, such as silicon oxide, aluminum oxide, and the like. The gap-filling dielectric layer 134 may be formed by a chemical vapor deposition method.

The material of the first polishing stop layer 112 is different from that of the first low-k dielectric layer 110. When the first polishing stop layer 112 is exposed, the planarization process is stopped. The first polishing stop layer 112 may be, for example, silicon nitride.

Figure 1D:
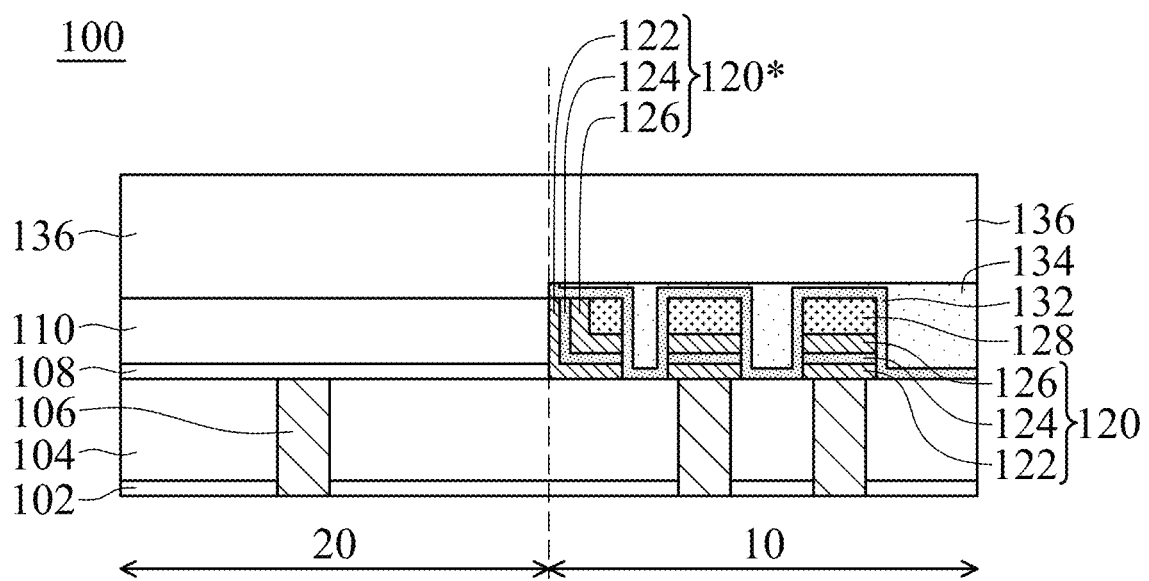

Referring to FIG. 1D, the first polishing stop layer 112 is removed. For example, a mask layer may be used to protect the array region 10 and the first polishing stop layer 112 may be removed by a wet etching process. Next, a second low-k dielectric layer 136 is formed on the gap-filling dielectric layer 134 and the first low-k dielectric layer 110. The dielectric constant of the second low-k dielectric layer 136 is less than 3, and the material of the second low-k dielectric layer 136 may be the same as or similar to that of the first low-k dielectric layer 110. Therefore, the operating speed of the logic circuit located in the peripheral area 20 can be increased, and the operating speed of the memory cell 120 located in the array area 10 can be also increased. As a result, the performance of the resistive random access memory structure 100 can be further improved.

Figure 1E:
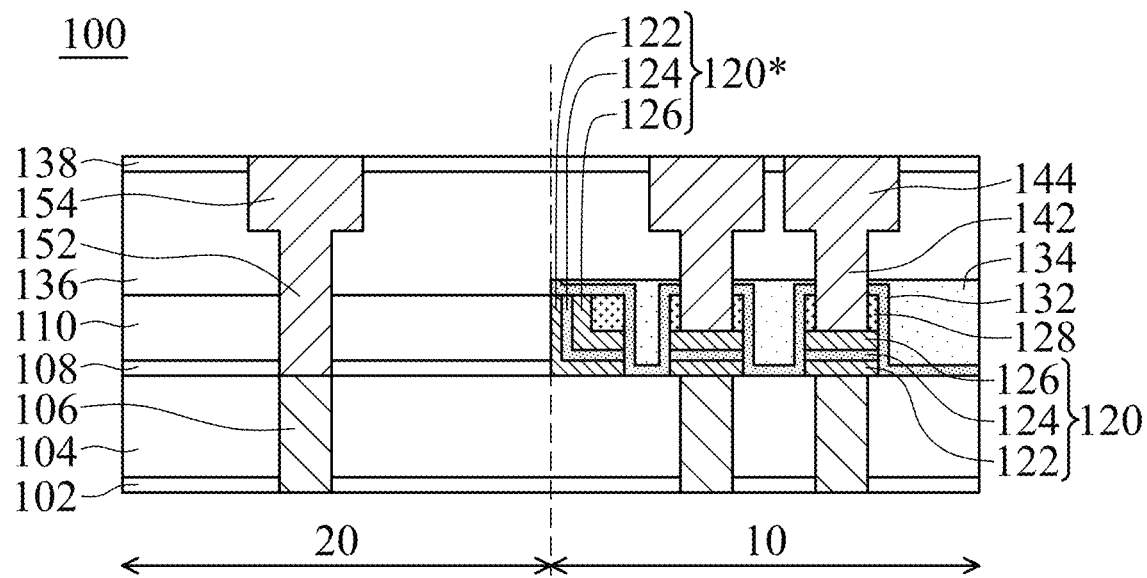

Referring to FIG. 1E, a second polishing stop layer 138 is formed on the second low-k dielectric layer 136. The material of the second polishing stop layer 138 may be the same as or similar to that of the first polishing stop layer 112. Then, a second planarization process (for example, a chemical mechanical polishing process) may be optionally performed to make the second polishing stop layer 138 have a flat top surface. In such an embodiment, the second polishing stop layer 138 is polished. Therefore, the top surface of the second low-k dielectric layer 136 is not polished.

Next, a dual damascene process is performed. As shown in FIG. 1E, in the array region 10, a first conductive plug 142 is formed in the gap-filling dielectric layer 134 and the second low-k dielectric layer 136, and a first conductive line 144 is formed in the second the low-k dielectric layer 136. In the peripheral region 20, a second conductive plug 152 is formed in the first low-k dielectric layer 110 and the second low-k dielectric layer 136, and a second conductive line 154 is formed in the second low-k dielectric layer 136.

In the present embodiment, each of the first conductive plug 142, the first conductive line 144, the second conductive plug 152, and the second conductive line 154 is a single-layer conductive material layer structure including copper. The conductive material layer may include tungsten, aluminum, copper, or other suitable metals. The electrical conductivity of copper is good, so that the operating speed of the logic circuit and the memory cell 120 can be increased. In other embodiments, each of the first conductive plug 142, the first conductive line 144, the second conductive plug 152, and the second conductive line 154 is a dual-layer structure including a conductive liner layer and a conductive material layer. The conductive liner layer can improve the adhesion between the conductive material layer and the low-k dielectric layer, and can prevent metal atoms from diffusing into the low-k dielectric layer. The conductive liner layer may include titanium, titanium nitride, or other suitable conductive materials.

Afterwards, other conventional processes can be performed to complete the resistive random access memory structure 100. These conventional processes will not be described in detail herein.

In the present embodiment, the memory cell 120 and the gap-filling dielectric layer 134 in the array region 10 are formed after the first low-k dielectric layer 110 in the peripheral region 20 is formed. Furthermore, the first polishing stop layer 112 is formed on the peripheral region 20 to cover the top surface of the first low-k dielectric layer 110. Such a process can significantly improve the yield and reliability of the product without significantly increasing the complexity of the process, the production cost, and the production time.

More specifically, referring to FIG. 1B and FIG. 3, the resistive random access memory structure 100 includes the array region 10 and the peripheral region 20 surrounding the array region 10. A plurality of resistive random access memory structures 100 are usually formed on a wafer. The gap-filling ability of the material of the first low-k dielectric layer 110 is poor. If the memory cells 120 and the gap-filling dielectric layer 134 are formed in the array region 10 first, the first low-k dielectric layer 110 will have uneven top surface when the first low-k dielectric layer 110 is formed on the wafer. Therefore, a planarization process is required for planarizing the first low-k dielectric layer 110. In such situation, the gap-filling dielectric layer 134 may be used as a polishing stop layer. However, the material of the gap-filling dielectric layer 134 and the material of the first low-k dielectric layer 110 have different properties, such as hardness and mechanical strength. When the first low-k dielectric layer 110 and the gap-filling dielectric layer 134 are polished simultaneously, the polishing pressure may cause cracks to occur at the interface between the gap-filling dielectric layer 134 and the first low-k dielectric layer 110. As a result, the memory cell 120 in the array area 10 will be damaged accordingly. Furthermore, solution (for example, a polishing solution or an etching solution) in the subsequent process may penetrate into the substrate 102 in the array region 10 or the peripheral region 20 along these cracks, thereby causing element damage. As a result, the yield and reliability of the resistive random access memory 100 will be reduced.

In the present embodiment, the first low-k dielectric layer 110 is formed on the entire wafer first, and then, the first low-k dielectric layer 110 in the array region 10 is removed. Therefore, the first low-k dielectric layer 110 has a flat top surface, and there is no need to perform a planarization process on the first low-k dielectric layer 110.

Furthermore, In the present embodiment, the first polishing stop layer 112 is formed on the peripheral region 20 to cover the top surface of the first low-k dielectric layer 110. When the gap-filling dielectric layer 134 is polished, it is possible to avoid polishing the first low-k dielectric layer 110 and the gap-filling dielectric layer 134 simultaneously. Compared with the first low-k dielectric layer 110, the first polishing stop layer 112 has the properties which are closer to the properties of the gap-filling dielectric layer 134. Therefore, the occurrence of the cracks can be significantly reduced or avoided, and the yield and reliability of the product can be improved.

In the present embodiment, the second low-k dielectric layer 136 is also located in the array region 10, so that the operating speed of the memory cells 120 can be improved. As a result, the performance of the resistive random access memory structure 100 can be further improved.

In the present embodiment, if the first polishing stop layer 112 is thick enough, it can be ensured that the top surface of the first low-k dielectric layer 110 is not exposed when the gap-filling dielectric layer 134 is polished. On the other hand, if the first polishing stop layer 112 is thin enough, the second low-k dielectric layer 136 may have a substantially flat top surface, and therefore, the second planarization process may be omitted. In some embodiments, the thickness of the first polishing stop layer 112 is 10-60 nm. In other embodiments, the thickness of the first polishing stop layer 112 is 20-40 nm.

In addition, if the top surface of the first polishing stop layer 112 is too low, the first planarization process may cause the memory cells 120 to be damaged. As a result, it is disadvantageous for improving the yield of the product. On the other hand, if the top surface of the first polishing stop layer 112 is too high, the thickness of the second low-k dielectric layer 136 located in the array region 10 decreases. As a result, it is disadvantageous for improving the performance of the resistive random access memory structure 100. In order to balance the performance and yield of the product, the top surface of the first polishing stop layer 112 may be higher than or coplanar with the top surface of the protective layer 132 covering the memory cells 120.

Referring to FIG. 1E, in some embodiments, the resistive random access memory structure 100 is provided. The resistive random access memory structure 100 includes the substrate 102, and the substrate 102 includes the array region 10 and the peripheral region 20. The first low-k dielectric layer 110 is located in the peripheral region 20, and the dielectric constant of the first low-k dielectric layer is less than 3. A plurality of memory cells 120 are located in the array region 10 and on the substrate 102, and the dummy memory cell 120* is located at the boundary between the array region 10 and the peripheral region 20. The gap-filling dielectric layer 134 is located in the array region 10. The gap-filling dielectric layer 134 covers the memory cells 120 and fills the space between adjacent memory cells 120. The material of the gap-filling dielectric layer 134 is different from the material of the first low-k dielectric layer 110. The protective layer 132 is located in the array region 10 and conformally covers the memory cell 120 and the dummy memory cell 120*. The protective layer 132 is located between the memory cells 120 and the gap-filling dielectric layer 134. The second low-k dielectric layer 136 is located on the gap-filling dielectric layer 134 and the first low-k dielectric layer 110. The dielectric constant of the second low-k dielectric layer 136 is less than 3. A plurality of first conductive plugs 142 are located in the gap-filling dielectric layer 134, and each of the first conductive plugs 142 is in contact with one of the memory cells 120. The dummy memory cell 120* is not in contact with any one of the first conductive plugs 142. The second conductive plug 152 is located in the first low-k dielectric layer 110. The second polishing stop layer 138 is located in the peripheral region 20 and its top surface is substantially coplanar with the top surface of the second conductive line 154.

In the present embodiment, the first low-k dielectric layer 110 located in the peripheral region 20 is formed first, and then, the memory cells 120 and the gap-filling dielectric layer 134 in the array region 10 are formed. Therefore, the dummy memory cell 120* is formed at the boundary between the array region 10 and the peripheral region 20, as shown in FIG. 1E. The dummy memory cell 120* includes the bottom electrode layer 122, the resistance switching layer 124, and the top electrode layer 126. The bottom electrode layer 122 is conformally formed on the sidewalls of the first low-k dielectric layer 110 and the top surface of the substrate 102. The resistance switching layer 124 is conformally formed on the sidewalls of the bottom electrode layer 122. The top electrode layer 126 is conformally formed on the sidewalls of the resistance switching layer 124. The first low-k dielectric layer 110, the bottom electrode layer 122, the resistance switching layer 124, and the top electrode layer 126 are sequentially arranged in the direction parallel to the top surface of the substrate 102. The top surface of the dummy memory cell 120* may be higher than or coplanar with the top surface of any one of the memory cells 120.

As shown in FIG. 3, the dummy memory cell 120* is located at the boundary between the array region 10 and the peripheral region 20, and surrounds the array region 10. Therefore, in the subsequent processes, the dummy memory cell 120* can prevent the array region 10 and the peripheral region 20 from affecting each other. Furthermore, when the first planarization process or the second planarization process is performed, the dummy memory cell 120* can be used as a buffer layer to reduce the stress generated by the planarization process. Therefore, the yield of the product is improved.

In the present embodiment, as shown in FIG. 1E, the hard mask layer 128 is located on the memory cell 120. The hard mask layer 128 is covered by the protective layer 132 and surrounds the first conductive plug 142. In other embodiments, the hard mask layer 128 is completely removed during the dual damascene process without remaining on the top electrode layer 126. In other embodiments, the hard mask layer 128 is not formed on the top electrode layer 126.

In the present embodiment, as shown in FIG. 1E, in the array region 10, the bottom surface of the second low-k dielectric layer 136 is in direct contact with the top surface of the gap-filling dielectric layer 134. Since the second low-k dielectric layer 136 is formed in the array region 10, the electrical performance of the memory device can be improved. For example, the capacitance effect can be reduced, and the heat generated during the operation of the memory cells 120 can be reduced. In the peripheral region 20, the bottom surface of the second low-k dielectric layer 136 is in direct contact with the top surface of the first low-k dielectric layer 110. In other embodiments, in order to make the top surface of the second low-k dielectric layer 136 flatter, the first polishing stop layer 112 is not removed. Therefore, in the peripheral region 20, the bottom surface of the second low-k dielectric layer 136 is in direct contact with the top surface of the first polishing stop layer 112.

FIGS. 2A-2E are cross-sectional views corresponding various steps of manufacturing a resistive random access memory structure 200 in accordance with other embodiments of the present invention. In FIGS. 2A-2E, the elements that are the same as those shown in FIGS. 1A-1E are denoted by the same reference numerals. In order to simplify the description, the elements and their forming process steps that are the same as those shown in FIGS. 1A-1E are not be described in detail herein.

Figure 2A:
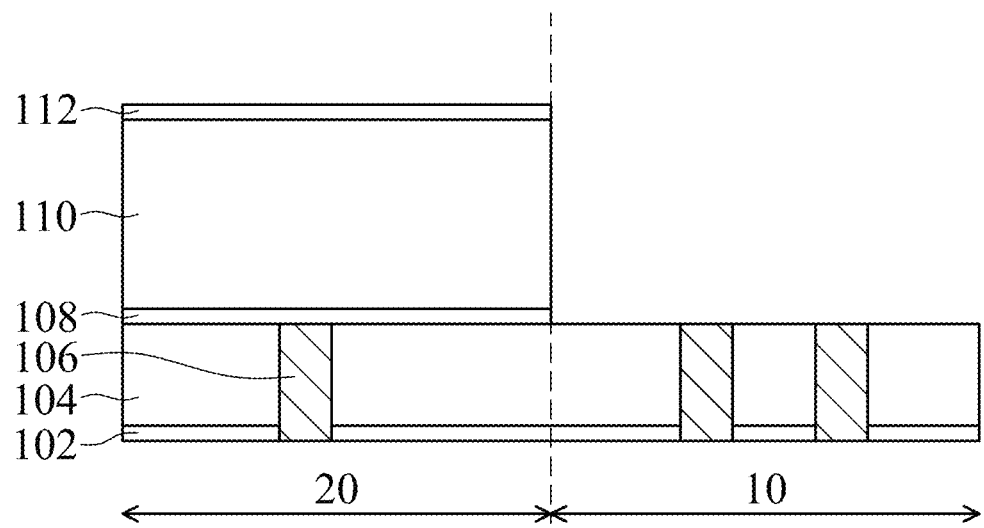
FIGS. 2A-2E are cross-sectional views corresponding various steps of manufacturing a resistive random access memory structure in accordance with other embodiments.
Figure 2B:
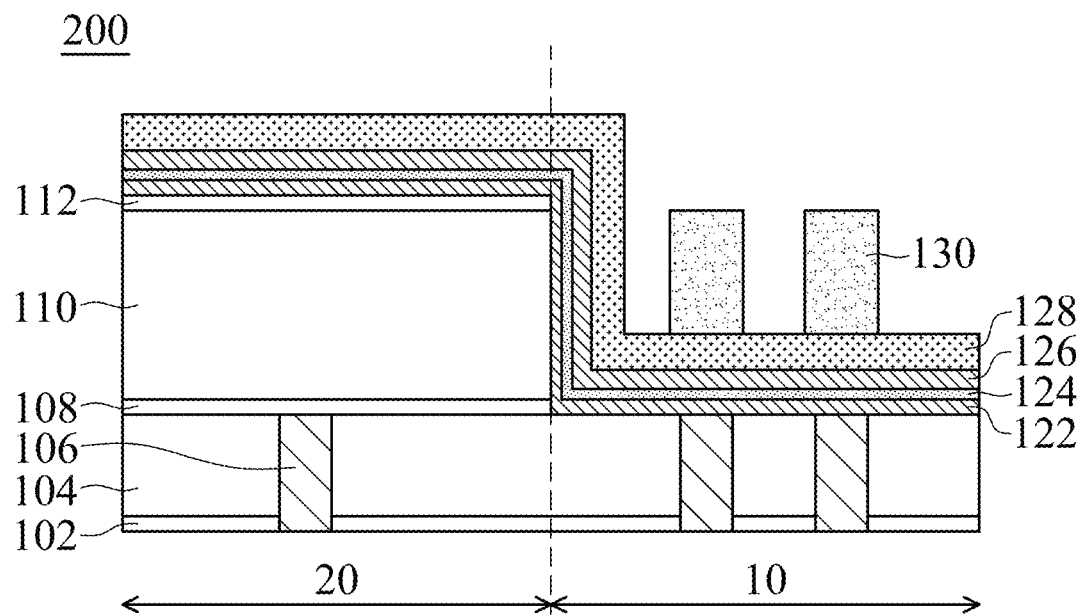
Figure 2C:
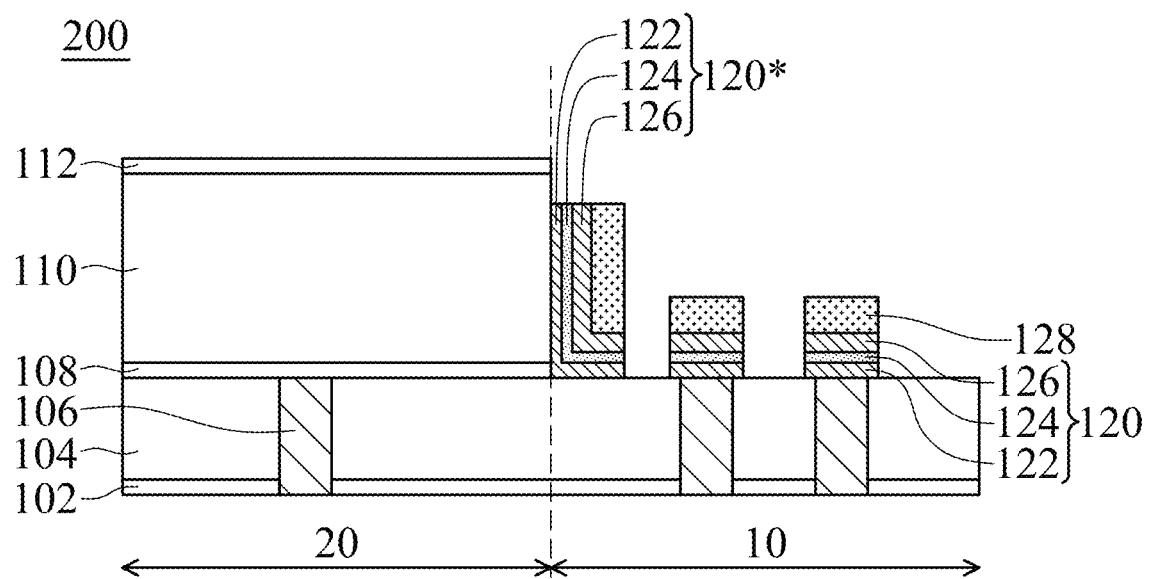
Figure 2D:
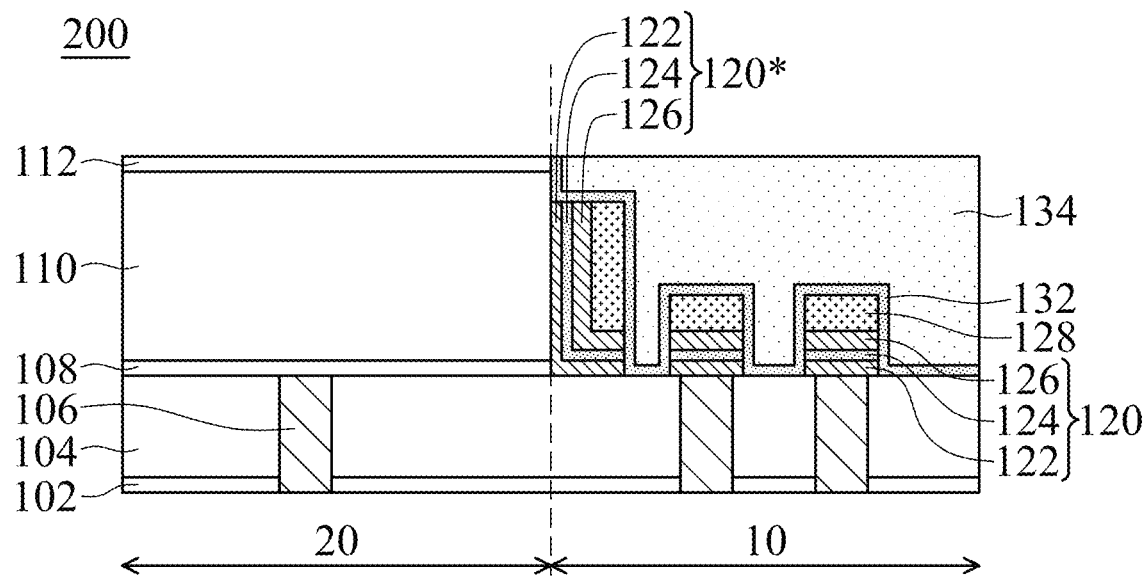
Figure 2E:
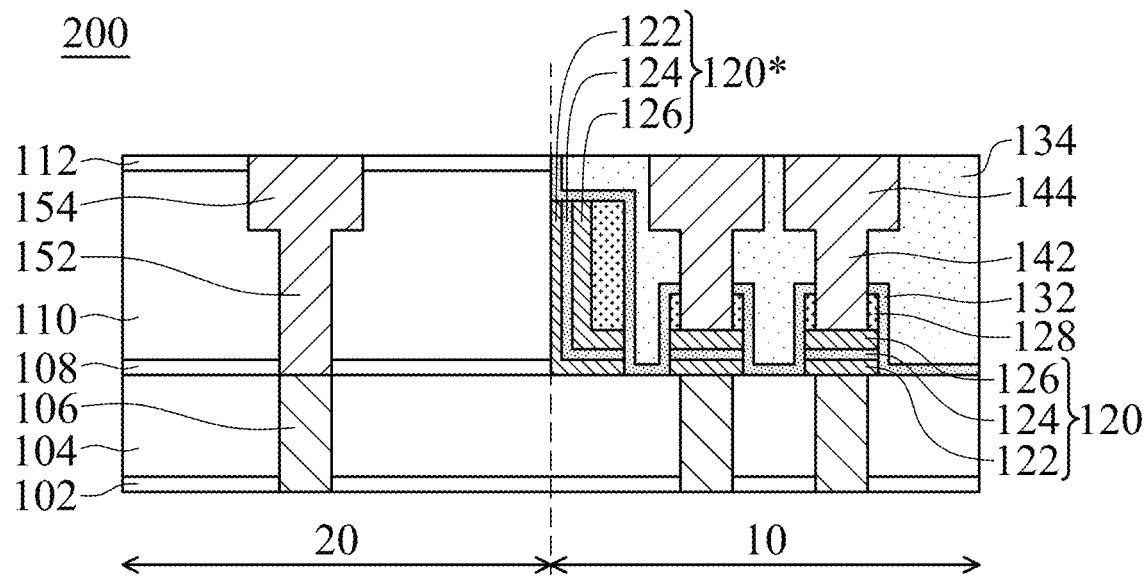

FIG. 2B is similar to FIG. 1A, and the difference is that the first low-k dielectric layer 110 in FIG. 2B has a larger height. FIG. 2C is similar to FIG. 1B, and the difference is that the dummy memory cell 120* in FIG. 2C has a larger height. FIG. 2D is similar to FIG. 1C, and the difference is that the gap-filling dielectric layer 134 of FIG. 2D has a larger height. FIG. 2E is similar to FIG. 1E, and the difference is that the second low-k dielectric layer 136 does not exist in FIG. 2E.

Referring to FIG. 2E, after the gap-filling dielectric layer 134 in the array region is formed, the first planarization process is performed so that the top surface of the first polishing stop layer 112 and the top of the gap-filling dielectric layer 134 are coplanar with each other. In some embodiments, the first planarization process is a chemical mechanical polishing process. In the present embodiment, the polishing is performed on the first polishing stop layer 112. Therefore, the top surface of the first low-k dielectric layer 110 is not polished.

Similar to the embodiments shown in FIGS. 1A-1E, in the present embodiment, it is also possible to avoid polishing the first low-k dielectric layer 110 located in the peripheral region 20 and the gap-filling dielectric layer 134 in the array region 10 simultaneously.

Furthermore, in the present embodiment, as shown in FIG. 2A, the first low-k dielectric layer 110 having a predetermined height is directly formed in the peripheral region 20. Therefore, the steps of forming the second low-k dielectric layer 136 and the second polishing stop layer 138 can be omitted. The second planarization step may also be omitted. As a result, the process can be greatly simplified.

In addition, during the first planarization process, the removal rate of the gap-filling dielectric layer 134 is higher than the removal rate of the first polishing stop layer 112. Therefore, dishing may occur in the array region 10 easily. If the top surface of the first polishing stop layer 112 and the top surface of the protective layer 132 are too close, the memory cells 120 will be damaged easily. In the present embodiment, the first low-k dielectric layer 110 has a larger height. Even if the dishing occurs in the array region 10, the memory cell 120 is not damaged. In other words, in the present embodiment, the operation window or tolerance of the planarization process is larger, which is advantageous for mass production.

In summary, in the manufacturing method of the resistive random access memory structure provided by the embodiments of the present invention, it is possible to avoid polishing the low-k dielectric layer located in the peripheral region and the gap-filling dielectric layer located in the array region simultaneously. In such a process, even if the low-k dielectric layer located in the peripheral region and the gap-filling dielectric layer located in the array region use different dielectric materials, the above-mentioned cracks can be avoided during the planarization process. Therefore, the dielectric material of the array region and the dielectric material of the peripheral region can be independently selected according to their requirements. In the process provided by the embodiment of the present invention, the yield and reliability of the product can be significantly improved without significantly increasing the complexity of the process, the production cost, or the required production time.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing a resistive random access memory structure, comprising:
    providing a substrate, wherein the substrate comprises an array region and a peripheral region;
    forming a first low-k dielectric layer in the peripheral region, wherein the first low-k dielectric layer has a dielectric constant of less than 3;
    forming a plurality of memory cells on the substrate and in the array region;
    forming a dummy memory cell at a boundary between the array region and the peripheral region;
    forming a gap-filling dielectric layer on the substrate, wherein the gap-filling dielectric layer covers the plurality of memory cells and the dummy memory cell in the array region, wherein the gap-filling dielectric layer covers the first low-k dielectric layer in the peripheral region, and wherein a material of the gap-filling dielectric layer is different from a material of the first low-k dielectric layer; and
    forming a plurality of first conductive plugs in the gap-filling dielectric layer, wherein each of the plurality of first conductive plugs is in contact with one of the plurality of memory cells; and wherein the dummy memory cell is not in contact with any one of the plurality of first conductive plugs.

2. The method for manufacturing the resistive random access memory structure as claimed in claim 1, wherein forming the plurality of memory cells and the dummy memory cell comprises:
    after forming the first low-k dielectric layer in the peripheral region, conformally forming a bottom electrode layer on the first low-k dielectric layer and the substrate;
    conformally forming a resistance switching layer on the bottom electrode layer;
    conformally forming a top electrode layer on the resistance switching layer; and
    patterning the bottom electrode layer, the resistance switching layer, and the top electrode layer to form the plurality of memory cells and the dummy memory cell.

3. The method for manufacturing the resistive random access memory structure as claimed in claim 2, further comprising:
    forming a first polishing stop layer on a top surface of the first low-k dielectric layer;
    conformally forming a hard mask layer on the top electrode layer;
    after forming the hard mask layer, patterning the bottom electrode layer, the resistance switching layer, the top electrode layer, and the hard mask layer;
    conformally forming a protective layer on the substrate, wherein the protective layer conformally covers the plurality of memory cells and the dummy memory cell in the array region, and the protective layer covers the first polishing stop layer in the peripheral region; and
    forming a second conductive plug in the first low-k dielectric layer.

4. The method for manufacturing the resistive random access memory structure as claimed in claim 3, further comprising:
    performing a first planarization process, so that a top surface of the first polishing stop layer and a top surface of the gap-filling dielectric layer are coplanar with each other;
    removing the first polishing stop layer;
    forming a second low-k dielectric layer on the gap-filling dielectric layer and the first low-k dielectric layer, wherein the second low-k dielectric layer has a dielectric constant less than 3;
    forming a second polishing stop layer on the second low-k dielectric layer; and
    performing a second planarization process, so that the second polishing stop layer has a flat top surface.

5. The method for manufacturing the resistive random access memory structure as claimed in claim 4, wherein a top surface of the second low-k dielectric layer is not polished.

6. The method for manufacturing the resistive random access memory structure as claimed in claim 3, further comprising:
   performing a planarization process, so that a top surface of the first polishing stop layer and a top surface of the gap-filling dielectric layer are coplanar with each other.

7. The method for manufacturing the resistive random access memory structure as claimed in claim 6, wherein the top surface of the first low-k dielectric layer is not polished.

8. The method for manufacturing the resistive random access memory structure as claimed in claim 1, wherein a top surface of the dummy memory cell is higher than or coplanar with a top surface of any one of the plurality of memory cells.

9. The method for manufacturing the resistive random access memory structure as claimed in claim 1, further comprising forming contact plugs in an insulating layer on the substrate.

10. The method for manufacturing the resistive random access memory structure as claimed in claim 9, wherein positions of each of the memory cells correspond to one of the positions of the contact plugs, and each of the memory cells is electrically connected to one of the contact plugs.

* * * * *